United States Patent [19]

Iyer

[11] Patent Number: 4,638,347
[45] Date of Patent: Jan. 20, 1987

[54] GATE ELECTRODE SIDEWALL ISOLATION SPACER FOR FIELD EFFECT TRANSISTORS

[75] Inventor: Subramanian S. Iyer, Mt. Kisco, N.Y.

[73] Assignee: International Business Machines Corporation, Armonk, N.Y.

[21] Appl. No.: 763,897

[22] Filed: Aug. 9, 1985

Related U.S. Application Data

[63] Continuation of Ser. No. 447,543, Dec. 7, 1982, abandoned.

[51] Int. Cl.⁴ .................... H01L 29/94; H01L 29/78
[52] U.S. Cl. .................... 357/54; 357/23.3; 357/23.9; 357/59; 357/23.1
[58] Field of Search ............... 357/54, 59, 23.3, 23.9, 357/23.1

[56] References Cited

U.S. PATENT DOCUMENTS

| | | | |
|---|---|---|---|
| 4,023,195 | 5/1977 | Richman | 198/399 |
| 4,109,372 | 8/1978 | Geffken | 29/571 |
| 4,227,944 | 10/1980 | Brown et al. | 148/6 |
| 4,252,840 | 2/1981 | Minami | 357/54 |
| 4,337,115 | 6/1982 | Ikeda et al. | 357/54 |

OTHER PUBLICATIONS

IBM Tech. Discl. Bulletin, vol. 24, No. 1A, Jun. 1981, pp. 57-60, vol. 21, No. 3, Aug. 1978, pp. 1250-1251, vol. 24, No. 7A, Dec. 1981, pp. 3415-3416.

Primary Examiner—Martin H. Edlow
Assistant Examiner—Charles S. Small, Jr.
Attorney, Agent, or Firm—Pollock, Vande Sande & Priddy

[57] ABSTRACT

A sidewall isolation structure for field effect transistor which includes a first electrical insulating layer and a second electrical insulating layer contiguous with the first layer. The second electrical insulating material is etched above or below the surface level of the first insulating layer to provide recesses in the sidewall isolation structure, and method for the preparation thereof.

11 Claims, 8 Drawing Figures

GATE ELECTRODE SIDEWALL ISOLATION SPACER FOR FIELD EFFECT TRANSISTORS

This application is a continuation of application Ser. No. 447,543, filed Dec. 7, 1982, now abandoned.

DESCRIPTION

1. Technical Field

The present invention is concerned with certain sidewall isolation structures for field effect transistors. In particular, the present invention is concerned with a sidewall isolation structure for field effect transistors which structure contains a plurality of electrical insulating materials. The present invention is also concerned with a process for fabricating the sidewall isolation structure and, particularly, for fabricating a sidewall isolation structure having a plurality of insulating materials.

2. Background Art

The metallic type electrical connections to the source, drain, and gate regions of a field effect transistor can be achieved by various processes. One such procedure involves the selective reaction of a metal such as titanium, cobalt, palladium, or nickel with exposed silicon to obtain self-aligned contacts to the source, drain, and gate regions of the device. Achieving self-alignment is significant in the fabrication of field effect transistors since one of the most crucial steps in preparing FET devices is a lithographic masking step which requires high precision in registration (i.e., relative mask-to-mask alignment) and extreme care in execution.

With respect to the above procedure for achieving self-alignment of metallic type contacts to the source, drain, and gate regions of a FET device, it is important to maintain the electrical isolation of the gate from the source and drain regions. This is accomplished by providing an isolation or electrical insulation layer on the sidewalls of the gate (which can be referred to as "spacer") and between the gate and semiconductor substrate. To obtain self-aligned contacts, a metal is deposited over the entire region (the source, drain, gate, and over the sidewall isolation between the gate and the source and drain regions). Subsequent to this, the metal is reacted with the available exposed silicon which it contacts to form a metallic silicide. Since the sidewalls are of an isolation material such as an oxide or nitride, reaction between the metal and the sidewall should not occur to form silicide. Subsequent to this, the unreacted metal on the sidewall isolation can then be selectively etched away.

However, it has been observed in attempting to prepare devices by the procedure discussed above, that although free silicon is not present on the sidewalls, nonetheless, metallic silicides have formed thereon. This, in turn, causes electrical leakage between the source, drain, and gate areas across the spacer paths. It is not entirely understood as to what causes the silicide formation on the sidewalls, but it is believed that possibly silicon is diffused through the metal on the sidewall due to the temperature of the silicide formation and this leads to silicide formation there. This is particularly noticeable when employing metals such as cobalt and titanium to form the silicide.

DISCLOSURE OF INVENTION

In order to prevent possible diffusion paths on the silicon over the spacer and thereby eliminating electrical leakage across the spacer, the present invention provides a discontinuous metal film over the sidewall isolation layer rather than a continuous metal film as obtained in accordance with the above discussed technique.

Providing a discontinuous film over the sidewall isolation spacer prevents the formation of a continuous silicon diffusion path over the spacer. This prevents the formation of a continuous silicide film over the spacer and thereby precludes electrical leakage across the spacer after the unreacted metal has been selectively etched away.

This discontinuous path is created by recessing the sidewall isolation layer so that metal deposited thereon would be discontinuous over the isolation region. In particular, the sidewall isolation is fabricated of at least two different materials and the composite isolation region is then selectively etched in order to create a recess therein.

In particular, the present invention is concerned with a sidewall isolation structure for field effect transistors which structure comprises a first electrical insulating material and a second and different electrical insulating material. The second electrical insulating material is contiguous with and preferably embedded in the first electrical insulating material. Moreover, the second electrical insulating material is etched above or preferably below the surface level of the first electrical insulating material to provide a recess in the sidewall isolation structure. This, in turn, prevents the formation of a continuous metal film over the sidewall isolation structure.

Another aspect of the present invention is a process for preparing sidewall isolation for field effect transistors. The process comprises providing a first electrical insulating layer over at least the sidewalls of an electrically conductive region. A second and different electrical insulating layer is provided adjacent the first electrical insulating layer on at least the sidewalls of the conductive region.

Although the present invention can be practiced with only two layers, it is preferred to provide a third electrical insulating layer adjacent the second and different insulating layer on at least the sidewalls. The third electrical insulating layer, if provided, can have substantially the same or a different etch rate as does the second insulating layer or the first insulating layer. However, it is preferred that such a third layer have an etch rate substantially the same as that of the first electrical insulating layer. The layers are then etched whereby the second layer is etched at a rate different than the first layer to thereby provide recesses in the sidewall isolation. Preferably the second layer is etched at a rate faster than the first layer and third layer, if present, resulting in a recess below the surface level of the first and third layers.

BEST AND VARIOUS MODES FOR CARRYING OUT INVENTION

For convenience, the discussion of the fabrication steps is directed to the preferred aspect of employing a p-type silicon substrate as the semiconductive substrate and n-type impurities. This leads to the n-channel FET technology. Accordingly, it is understood that a n-type substrate and a p-type diffused or implanted dopant impurity can be employed according to the present invention in p-channel FET technology.

It is understood that when the discussion refers to n-type impurities, the process steps are applicable to p-type impurities and vice versa. Also, when reference is made to impurities of the "first type" and to impurities of a "second type", it is understood that the "first type" refers to the opposite conductivity. That is, if the "first type" is p, then the "second type" is n. If the "first type" is n, then the "second type" is p.

Although the fabrication process is described employing the preferred material, polycrystalline silicon, other suitable materials can be employed.

Figure 1:
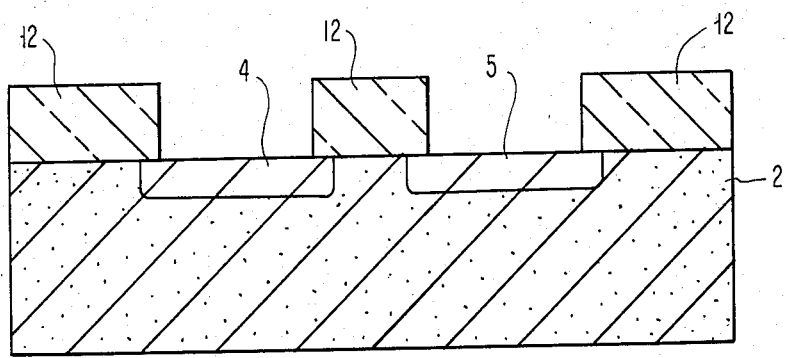
FIGS. 1-8 are cross-sectional views of a simplified field effect transistor in various stages of fabrication according to the present invention.

Referring to FIG. 1, there is shown a p-type silicon substrate 2 having any desired crystal orientation (e.g., <100>). Such can be prepared by slicing and polishing a p-type boule grown in the presence of a p-type dopant, such as boron following conventional crystal growth techniques. Other p-type dopants for silicon include aluminum, gallium, and indium.

Field oxide isolation 12 can be fabricated by any of the several known procedures including thermal oxidation of the semiconductor substrate or by well-known vacuum vapor deposition techniques. Furthermore, the field oxide 12 may be formed above the semiconductor surface or it may be partially or fully recessed into the semiconductor substrate. An example of one such procedure is the fully recessed oxide isolation technique disclosed in U.S. Pat. No. 3,899,363, disclosure of which is incorporated herein by reference.

For the purposes of illustration of the procedure of the present invention, a non-recessed field isolation oxide 12 will be used. The field isolation regions are generally about 4,000 to about 10,000 angstroms thick. The field oxide regions 12 and the regions under which source and drain regions 4 and 5 are formed are delineated by employing a lithographic mask. The mask is of a transparent material having opaque portions in a predetermined pattern. Next, source and drain regions 4 and 5 are formed in the p-silicon substrate 2, such as by thermal diffusion or ion-implantation of an impurity of the n-type. Examples of some n-type impurities for silicon substrates include arsenic, phosphorus, and antimony.

The field oxide 12 using a photolithographic technique is etched from that area where a thin gate oxide insulator layer 3 is to be subsequently grown.

Figure 2:
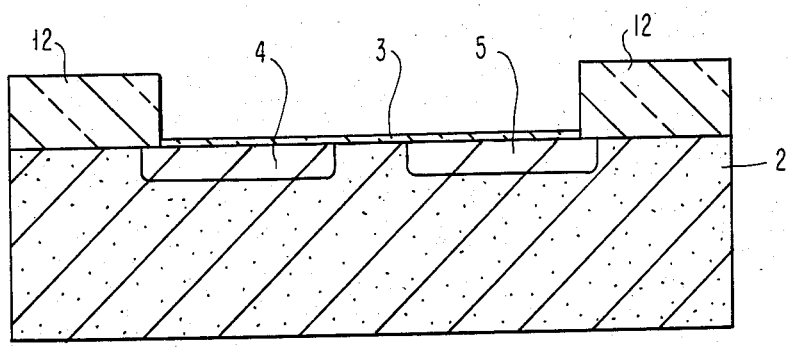
Figure 3:
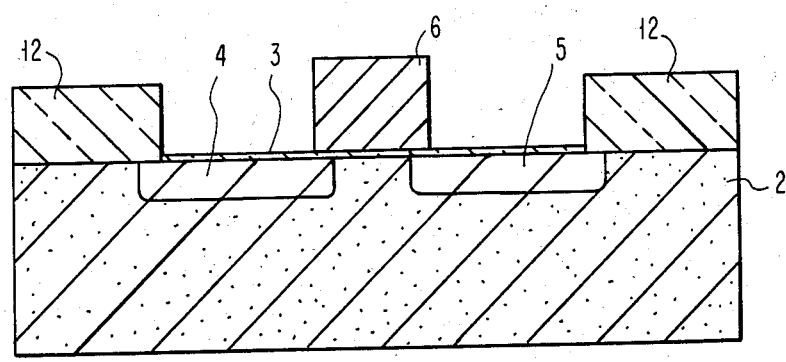

A relatively thin gate insulator layer of silicon dioxide 3 (see FIG. 2) is grown on or deposited onto the silicon substrate 2. This gate insulator, which is usually about 100 to about 1,000 angstroms thick, can be formed by thermal oxidation of the silicon substrate at about 800°–1000° C. in the presence of oxygen.

Next, the gate 6 of the FET is deposited and delineated by known photolithographic technique. The gate 6 of the FET is of preferably polycrystalline silicon and is generally doped to the same conductive type as the source and drain.

Figure 4:
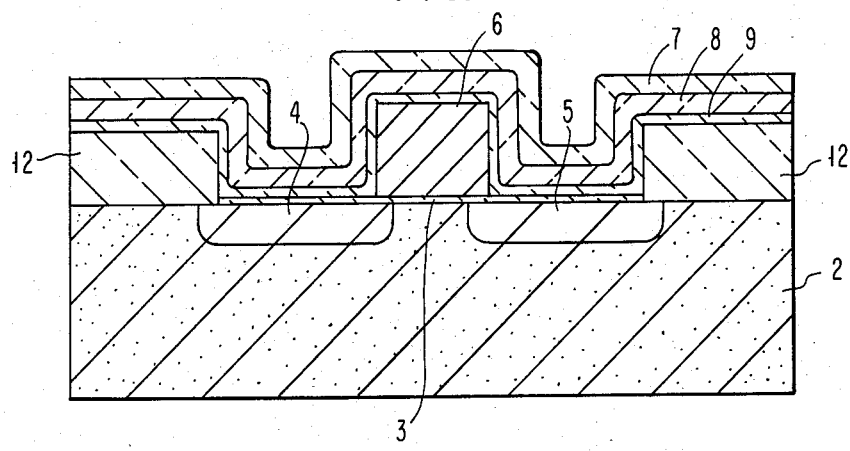

Next, a layer 7, of silicon dioxide is provided over the entire structure including the polycrystalline silicon gate 6 (see FIG. 4). This silicon dioxide layer can be grown on or deposited on to the substrate and the gate 6. This layer is usually about 500 to about 1,500 angstroms thick and can be formed by thermal oxidation of the silicon surface and polycrystalline silicon surface at about 800°–1000° C. in the presence of oxygen.

Next, a layer 8 of an electrically insulating material, different from the silicon dioxide, is provided over the silicon dioxide. An example of such a material is silicon nitride. Other materials which can be used as layer 7 or layer 8 include oxides such as aluminum oxide and magnesium oxide.

The silicon nitride can be formed by chemical vapor deposition and is usually about 100 to 1,000 angstroms thick.

An additional layer 9 of silicon dioxide is then deposited. The silicon dioxide layer is approximately 500 to 1,500 angstroms thick and may be formed by chemical vapor deposition.

Figure 5:
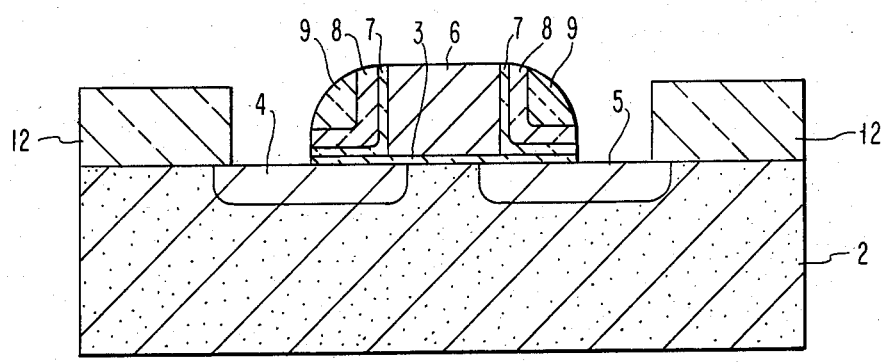

Through vertically directional reactive ion etching, silicon dioxide layer 7, silicon nitride layer 8, and silicon oxide layer 9 are etched so that as to obtain the structure shown in FIG. 5. Since the rates of etching of the silicon oxide and silicon nitride employing reactive ion etching are substantially the same, no depressions or recesses are formed in the isolation structure employing the reactive ion etching technique. Typical conditions of reactive ion etching include using a $CF_4$ gas at about 25 microns of prespure at a gas flow rate of about 40 standard cubic centimeters per minute and employing about 20 watts of power, which is equivalent to a power density of about 0.073 watts per $cm^2$. These particular parameters provide for an etch rate of about 160 angstroms per minute.

The sidewall spacer so formed is about 2000 Å wide at the base. Also, in this process, the source and drain regions are exposed. Source and drain may be formed, for example, by ion-implantation of n-type dopant at this stage.

Figure 6:
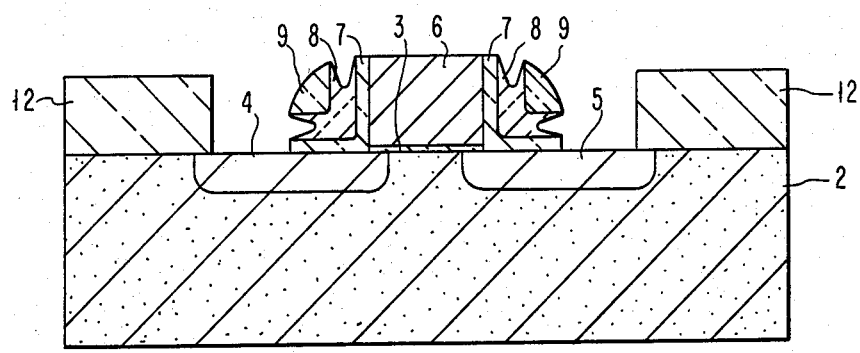

Next, the remaining silicon dioxide layer 7, silicon nitride layer 8, and silicon dioxide 9 are subjected to a chemical etch to thereby form recess in the sidewall isolation as illustrated in FIG. 6. A typical etch employed is phosphoric acid solution at about 180° C. The silicon nitride is etched to a much greater extent than the silicon dioxide in the presence of the phosphoric acid. Accordingly, recess in the sidewall isolation is achieved as illustrated in FIG. 6. Generally, the etch rate ratio of layer 8 to layers 7 and 9 is at least about 10:1 and, preferably, at least about 100:1.

The etching is carried out for about 2–10 minutes to cause a 200–1000 Å recess in the sidewall isolation.

Figure 7:
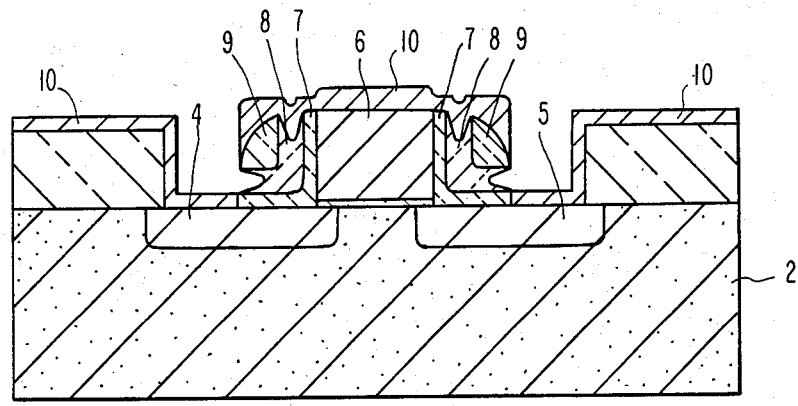

Next, a metal layer 10, such as cobalt, titanium, nickel, and platinum series metals is deposited over the structure such as by sputtering or, preferably, evaporation. The recesses prevent a continuous metallic film from forming on the sidewalls of the gate, as illustrated in FIG. 7.

Next, the metal is reacted with the silicon at elevated temperature such as about 400° to about 800° C. to provide a metallic silicide 11. The preferred metals employed are cobalt and titanium. The temperatures employed for the cobalt and titanium are at least about 550° C., while those for the platinum type metals are about 400° to about 500° C.

Figure 8:
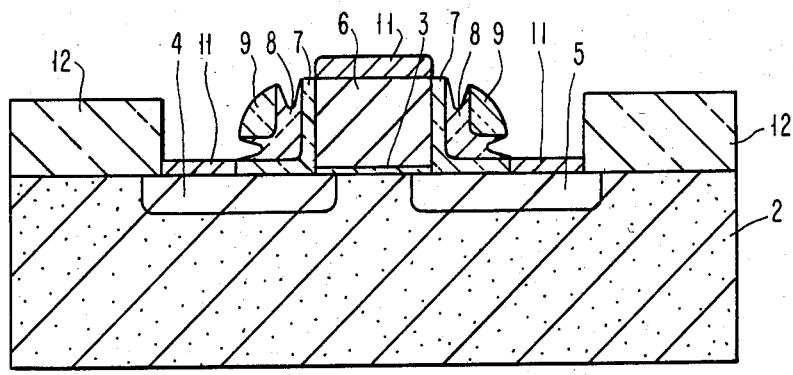

After formation of the silicide, the unreacted metal can be removed from the structure by etching in a material which will not effect the silicide, but will selectively remove the unreacted metal. For instance, with titanium, the etch employed can be a solution of 1:1:5 volume ratio of ammonium hydroxide, hydrogen peroxide, and water (see FIG. 8).

What is claimed is:

1. A sidewall isolation structure for the gate electrode of an insulated gate field effect transistor which comprises a first electrical insulating material and a second and different electrical insulating material contiguous with said first electrical insulating material, and wherein said second and different electrical insulating material being etched below the surface level of said first electrical insulating material and being etched to a greater extent than and at a rate faster than said first electrical insulating material to provide a recess in said sidewall isolation structure wherein said recess is such as to prevent the formation of a continuous metal film over the sidewall isolation.

2. The structure of claim 1 wherein said first electrical insulating material is silicon dioxide.

3. The structure of claim 2 wherein said second electrical insulating material is silicon nitride.

4. The structure of claim 1 wherein said second electrical insulating material is silicon nitride.

5. The sidewall isolation structure of claim 1 which further includes a third electrical insulating material adjacent said second and different electrical insulating material.

6. The sidewall isolation structure of claim 5 wherein said third electrical insulating material has an etch rate different from the etch rate of said second and different electrical insulating material.

7. The sidewall isolation structure of claim 5 wherein said third electrical insulating material has an etch rate substantially the same as the etch rate of said first electrical insulating material.

8. The structure of claim 5 wherein said first electrical insulating material is silicon dioxide.

9. The structure of claim 8 wherein said second electrical insulating material is silicon nitride.

10. The structure of claim 5 wherein said second electrical insulating material is silicon nitride.

11. The structure of claim 8 wherein said third electrical insulating material is silicon dioxide.

* * * * *